United States Patent
Ahmed

(10) Patent No.: US 10,153,401 B2
(45) Date of Patent: Dec. 11, 2018

(54) PASSIVATED MICRO LED STRUCTURES SUITABLE FOR ENERGY EFFICIENT DISPLAYS

(71) Applicant: Intel Corporation, Santa Clara, CA (US)

(72) Inventor: Khaled Ahmed, Anaheim, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/381,937

(22) Filed: Dec. 16, 2016

(65) Prior Publication Data

US 2018/0175248 A1     Jun. 21, 2018

(51) Int. Cl.
*H01L 33/44* (2010.01)
*H01L 33/06* (2010.01)
(Continued)

(52) U.S. Cl.
CPC .............. *H01L 33/44* (2013.01); *H01L 23/66* (2013.01); *H01L 25/0753* (2013.01); *H01L 25/167* (2013.01); *H01L 31/035236* (2013.01); *H01L 33/007* (2013.01); *H01L 33/0095* (2013.01); *H01L 33/06* (2013.01); *H01L 33/32* (2013.01); *H01L 33/42* (2013.01); *H01L 33/62* (2013.01); *H01L 2223/6677* (2013.01)

(58) Field of Classification Search
CPC ........................... H01L 29/862; H01L 31/0248
See application file for complete search history.

(56) References Cited

U.S. PATENT DOCUMENTS

| | | | |
|---|---|---|---|
| 2008/0232414 A1* | 9/2008 | Masui | H01S 5/18311 372/44.01 |
| 2011/0140081 A1* | 6/2011 | Jiang | H01L 33/0079 257/13 |

(Continued)

OTHER PUBLICATIONS

Huang, S., et al. Effective Passivation of AlGaN/GaN HEMTs by ALD-Grown AlN Thin Film IEEE Electron Device Letters, vol. 33, No. 4, Apr. 2012, pp. 516-518 (3 pages).

(Continued)

*Primary Examiner* — Cheung Lee
(74) *Attorney, Agent, or Firm* — Green, Howard & Mughal LLP

(57) ABSTRACT

LED structures passivated with a III-N passivation material including Al. The III-N passivation material may reduce nonradiative recombination, reducing leakage current of an LED structure, and/or improve luminous efficacy. An LED structure may include III-N materials in a multiple quantum well (MQW) structure, and the III-N passivation material including Al may have a wider bandgap than any of the materials in the MQW structure. The III-N passivation material may be AlN, which can be deposited as a binary compound at low temperatures to maintain quality of the MQW structure. The III-N passivation material can be selectively deposited on a sidewall of at least the MQW structure. The III-N passivation material can be unselectively deposited over an LED structure and then etched to form a III-N spacer along a sidewall of at least the MQW structure. Energy efficient RGB micro(μ) LED emissive displays may include passivated LED structures.

20 Claims, 12 Drawing Sheets

(51) Int. Cl.

| | |
|---|---|
| *H01L 33/32* | (2010.01) |
| *H01L 33/42* | (2010.01) |
| *H01L 33/62* | (2010.01) |
| *H01L 25/075* | (2006.01) |
| *H01L 25/16* | (2006.01) |
| *H01L 23/66* | (2006.01) |
| *H01L 33/00* | (2010.01) |
| *H01L 31/0352* | (2006.01) |

(56) References Cited

U.S. PATENT DOCUMENTS

| | | | |
|---|---|---|---|
| 2011/0233603 A1* | 9/2011 | Kim | H01L 33/38 257/99 |
| 2013/0146936 A1* | 6/2013 | Tsai | H01L 33/38 257/99 |
| 2016/0204305 A1* | 7/2016 | Chiu | H01L 25/0753 257/94 |

OTHER PUBLICATIONS

Koehler, A., et al. Atomic Layer Epitaxy AlN for Enhanced AlGaN/GaN HEMT Passivation IEEE Electron Device Letters, vol. 34, No. 9, Sep. 2013, pp. 1115-1117 (3 pages).

Nepal, N., et al. Epitaxial growth of AlN films via plasma-assisted atomic layer epitaxy Applied Physics Letters 103, 082110 (2013); doi: 10.1063/1.4818792; http://dx.doi.org/10.1063/1.4818792, (2013).

Mizuta, M. Low Temperature Growth of GaN and AlN on GaAs Utilizing Metalorganics and Hydrazine Japanese Journal of Applied Physics • vol. 25, No. 12—Dec. 1986 DOI: 10.11.

\* cited by examiner

A ←――――――――――――――――――→ A'

PASSIVATED MICRO LED STRUCTURES SUITABLE FOR ENERGY EFFICIENT DISPLAYS

BACKGROUND

Improving display efficiency can reduce power dissipation in mobile devices (e.g. phones, watches or other wearables, tablets, and notebooks). To date, liquid crystal display (LCD) technology has been the dominant display technology for both infrastructure devices (e.g., television) and mobile devices. Current LCD based displays only pass through ~5% of light from a backlight source (e.g., LED or CFL, etc.) leading to poor power efficiency, insufficient daylight display illumination, and poor viewing angles.

Considerable research and development has been expended on organic light emitting diode (OLED) display technology. OLED displays improve display power efficiency relative to LCD, though not dramatically. OLED technology also currently suffers from color fading, leading to decreased display endurance/lifetime. Another next-generation display technology under investigation is crystalline LED, also referred to as an inorganic LED (iLED) display or an RGB micro($\mu$) LED emissive display. A crystalline $\mu$LED display relies on an array of semiconductor LEDs. A $\mu$LED display, for example, may utilize RGB LED emitters for a picture element, or pixel. Relative to an OLED display, a $\mu$LED display has the potential to reduce power dissipation by an order of magnitude. Micro LED displays therefore hold the promise of significantly increasing battery life and enabling very high resolution displays in next generation device platforms.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION OF EXEMPLARY EMBODIMENTS

Figure 1:
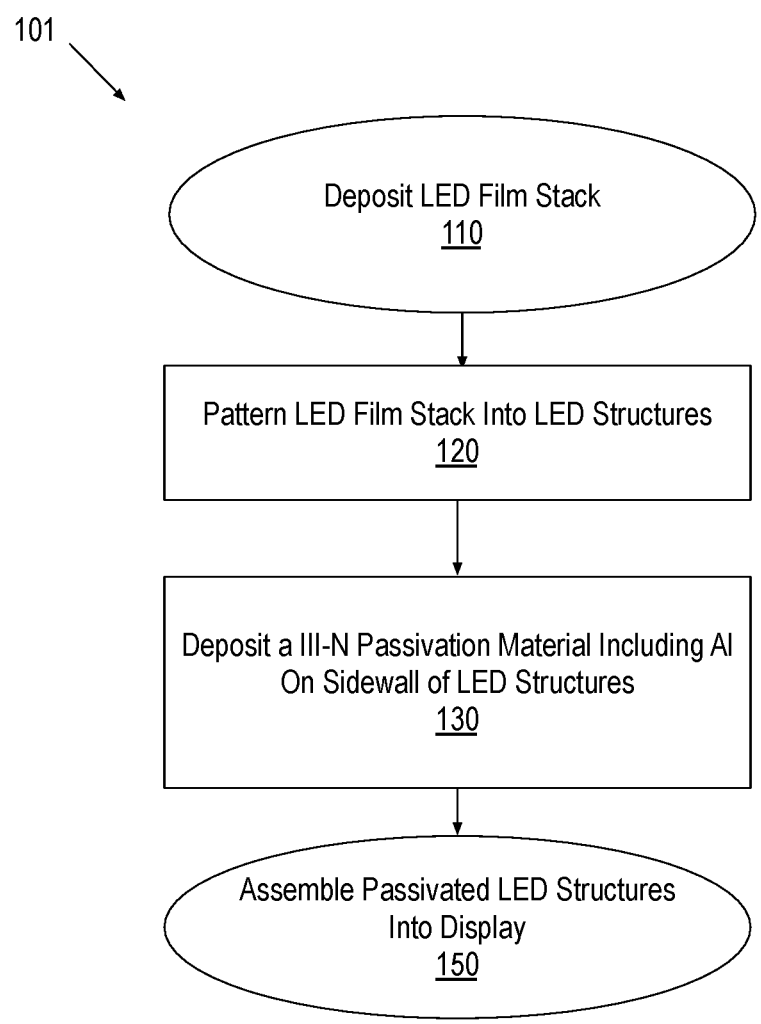
FIG. 1 illustrates a flow diagram of methods for fabricating a passivated LED structure, in accordance with some embodiments.

Embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings and are not intended to restrict the application of claimed subject matter. Therefore, the following detailed description is not to be taken in a limiting sense and the scope of claimed subject matter is defined solely by the appended claims and their equivalents.

In the following description, numerous details are set forth, however, it will be apparent to one skilled in the art, that embodiments may be practiced without these specific details. In some instances, well-known methods and devices are shown in block diagram form, rather than in detail, to avoid obscuring inventive aspects of the exemplary embodiments. References throughout this specification to "an embodiment" or "one embodiment" mean that a particular feature, structure, function, or characteristic described in connection with the embodiment is included in at least one embodiment. Thus, the appearances of the phrase "in an embodiment" or "in one embodiment" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the first and second embodiments are not mutually exclusive.

As used in the description of the exemplary embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical, optical, or electrical contact with each other, and/or that the two or more elements co-operate or interact with each other (e.g., as in a cause an effect relationship).

The terms "over," "under," "between," and "on" as used herein refer to a relative position of one component or material layer with respect to other components or layers where such physical relationships are noteworthy. For example, in the context of material layers, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similar distinctions are to be made in the context of component assemblies.

LED structures passivated with a III-N passivation material comprising Al are described further below. III-N passivation material in accordance with some embodiments may reduce nonradiative recombination and/or leakage current of an LED structure, and/or improve luminous efficacy. Noting that the impact of surface recombination on LED performance scales with reductions in LED footprint, passivated structures described herein are particularly well-suited to the application of μLEDs having areas typically less than 100 μm² (e.g., 10 μm on a side).

In some embodiments, a passivated LED structure includes a material stack suitable for emitting over at least some portion of the visible light band (e.g., red, green, blue). A passivated LED may, for example, entail a multiple quantum well (MQW) structure including a III-N material stack. The III-N passivation material including Al may have a wider bandgap than any of the materials in the MQW structure and may satisfy dangling bonds on surfaces (e.g., a sidewall) of the MQW structure exposed to the etch processes employed to pattern LED structures from a material stack. In some embodiments, the III-N passivation layer is deposited over sidewalls of at least some of the material layers in the MQW structure with a low-temperature (e.g., <500° C.) deposition process, advantageously maintaining quality of the MQW structure. In some embodiments, the III-N passivation material includes a layer of AlN in direct contact with at least some of the materials in the MQW structure. A passivation layer including AlN in accordance with some embodiments described herein is suitable for red, green, or blue GaN-based LEDs, for example.

As also described further below, in some embodiments the III-N passivation material is selectively deposited on a sidewall of at least the MQW structure. In some other embodiments, the III-N passivation material is unselectively (e.g., blanket) deposited over an LED structure and then etched back to selectively form a III-N spacer along a sidewall of at least the MQW structure.

As also described further below, passivated LED structures in accordance with some embodiments are incorporated into a RGB micro(μ) LED emissive display assembly. Such display assemblies may offer high power efficacies, and/or reduced power consumption. This is particularly advantageous for mobile devices powered by battery since a reduction is display power consumption can greatly reduce the battery discharge rate.

FIG. 1 illustrates a flow diagram of methods 101 for fabricating a passivated LED structure, in accordance with some embodiments. Methods 101 begin at operation 110 with deposition of an LED film stack. Alternatively, methods 101 receive such an LED film stack as an input. In some advantageous embodiments, the LED film stack deposited or received at operation 110 is based on a III-N material stack, and may, for example, include any GaN-based multiple quantum well (MQW) structure. GaN-based LEDs can be made to emit within various portions of the visible light band (e.g., over red, green, and blue bands) by tuning the composition, and therefore the bandgap, of various material layers within the MQW structure. Although crystallinity and crystallographic orientation of the MQW may vary with implementation, in some exemplary embodiments the c-axis is oriented substantially parallel with the film thicknesses of the LED stack (i.e. growth direction). The LED film stack deposited or received at operation 110 may further include a p-type semiconductor material layer and/or an n-type semiconductor material layer. Within the LED stack, the MQW structure (if present) is between the semiconductor layers that are doped with an electrically active impurity. The LED film stack deposited or received at operation 110 may also include either, or both, an anode contacting the p-type semiconductor material layer(s) and/or a cathode contacting the n-type semiconductor material layer(s). Alternatively, the anode and/or cathode may be fabricated after the LED film stack deposited or received at operation 110 is further processed into LED structures, for example as further described below.

Methods 101 continue at operation 120 where the LED film stack is patterned into a plurality of LED structures or elements. Individual LED structures, originating from the same film stack, may be operable to emit over substantially the same band. Patterning operation 120 may entail any lithographic mask patterning followed by a masked etch of the LED film stack. The masked etch may clear every material layer within the LED film stack, or not (e.g., stopping on a doped semiconductor layer or anode/cathode, etc.). In some embodiments, at least an MQW structure within the LED film stack is etched through, for example with any dry (i.e., plasma) etch process known to be suitable for the MQW material layers. Patterning operation 120 may generate LED structures having any area (footprint). In some advantageous embodiments however, the LED structures patterned at operation 120 have an area no more than 100 μ², and may be a little as 1 μm², or less. Exemplary emitter areas include, but are not limited to: 1 μm×1 μm; 2 μm×2 μm; 5 μm×5 μm; and 10 μm×10 μm. The inventor has found LED structures of such small dimension may suffer poor power efficiency, degrading by 10×or more, from that of significantly larger structures (e.g., 200 μm×200 μm). Although not bound by theory, this relatively poor efficiency may be attributable to non-radiative surface recombination associated with surfaces of the LED structure exposed to plasma etching. For example, unsatisfied or "dangling" bonds may be present at surfaces of the MQW structure following patterning etch operation 120. This may be particularly true for MQW structures that include III-N materials, for which a highly physical etching process may be needed.

Methods 101 continue at operation 130 where the III-N passivation material including Al is deposited over the LED structure(s). The III-N passivation material may include one or more material layer. The material in direct contact with a sidewall of the etched LED structure may be a III-N binary, tertiary, or quaternary compound including Al. The band gap of III-N compounds generally increases with increasing Al content. In some embodiments, the III-N passivation material deposited at operation 130 has sufficient Al content to have a bandgap greater than that of any materials in an MQW structure. In further embodiments, the III-N passivation material deposited at operation 130 has sufficient Al content to have a bandgap that renders the III-N passivation material transmissive (e.g., transparent) to at least a portion of the band over which the LED structure is to emit. As such, III-N passivation material in accordance with embodiments should not significantly impact visible light flux of the LED structure.

In some advantageous embodiments, the III-N passivation material includes a layer of predominantly the binary compound AlN in direct contact with one or more III-N material of an LED structure. AlN has a bandgap around 6.2 eV, which is transparent to the visible light band. The Al/N ratio may vary in an AlN binary compound. A binary compound of AlN may further include trace level impurities, such as oxygen and/or carbon, for example as a result of unintentional doping during deposition operation 130 and/or subsequent solid-state interdiffusion of dissimilar materials in intimate contact. In some exemplary embodiments, the AlN material layer forms an interface with a surface of the LED structure exposed to the patterning etch operation 120, such as, but not necessarily limited to, sidewalls of an MQW structure.

III-N passivation material may be deposited to any thickness. In some exemplary embodiments, an AlN layer formed at operation 130 has a thickness of 2-20 nm. Within such a thickness range, minimal defects due to lattice mismatch between AlN (a ~3.112Å) and III-N materials in an MQW (e.g., GaN a~3.189Å) should be induced in either the MQW structure or the III-N passivation material. The III-N passivation material may have any microstructure, which may depend, for example, on the deposition parameters, such as deposition temperature. The III-N passivation material may be crystalline (e.g., monocrystalline or polycrystalline), and if so, may be epitaxial with an MQW structure. For exemplary poly-crystalline (e.g., nano or micro crystalline) embodiments, the III-N passivation material may have a preferential texture (e.g., c-axis of a population of the III-N passivation material crystals is preferentially aligned with the c-axis of the MQW structure) as a result of templating off the MQW structure. In monocrystalline III-N passivation material embodiments, the c-axis of the III-N passivation material is aligned with the c-axis of the MQW structure.

In some advantageous embodiments, deposition of the III-N passivation material at operation 130 is performed at a low temperature (e.g., <500° C.). Performing the deposition operation 130 at a low temperature may minimize interdiffusion or intermixing of the various materials present within the LED structure. For example, compositional intermixing of the MQW may be minimized for well-controlled bandgap offsets. In further examples where the LED structure includes an impurity-doped semiconductor (e.g., p-type GaN), migration of the dopant impurity (e.g., Mg) into the MQW structure is also to be minimized. Within the class of III-N material compounds, many require high deposition temperatures (e.g., 500-900° C.), which could degrade the quality of the LED structure. Exemplary embodiments where an AlN binary compound is deposited at operation 130 have the further advantage that AlN can be deposited at some of the lowest temperatures within the class of III-N materials. AlN passivation layers in accordance with some embodiments are deposited at 250-500° C., as a function of at least the deposition technique and/or precursor(s) employed. In some ultra-low temperature embodiments described further below, hydrazine is employed as the nitrogen source. Hydrazine, while being more challenging to handle than a $NH_3$ source, has a lower cracking temperature that can be leveraged in the context of III-N passivation layer deposition to maintain the quality of a passivated LED structure.

Methods 101 complete with assembling the passivated LED structures into a display at operation 150. Alternatively, methods 101 may simply output the passivated LED structures for their use in an arbitrary downstream application. In some embodiments, an active matrix μLED display panel may be fabricated by combining passivated μLED structures that emit red, green and blue colors to form an RGB pixel. Arrays of pixels may be assembled with each pixel including passivated LEDs of different colors, each of which may have been fabricated on different donor substrates and then transferred from the donor and assembled onto a display backplane. The display backplane may have any architecture, but is some exemplary embodiments the backplane includes LED array drive circuitry. Such drive circuitry may include a plurality of transistors, which are thin film transistors (TFTs) in some exemplary embodiments.

Figure 2:
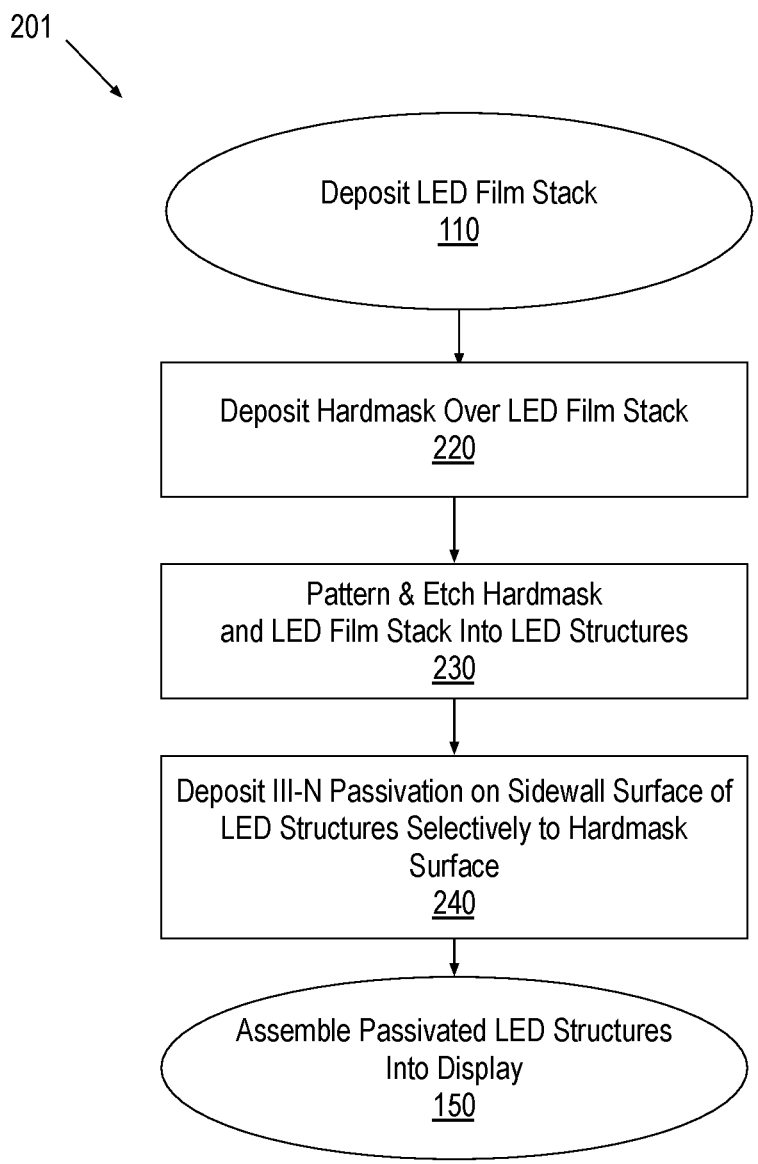
FIG. 2 illustrates a flow diagram of methods for selectively depositing a passivation material on an LED structure, in accordance with some embodiments.

FIG. 2 illustrates a flow diagram of methods 201 for selectively depositing a III-N passivation material on an LED structure, in accordance with some embodiments. Methods 201 may be considered a subset of methods 101. FIG. 3A-3I illustrate cross-sectional views of LED structures evolving as selected operations of the methods 201 are practiced, in accordance with some embodiments. Structural features called out in FIG. 3A-3I are therefore applicable to both methods 201 and 101.

Figure 3A:
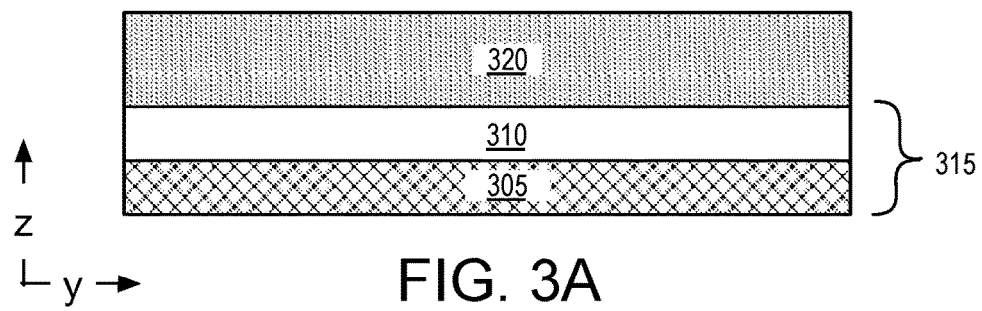
FIGS. 3A, 3B, 3C, 3D, 3E, 3F, 3G, 3H and 3I illustrate cross-sectional views of LED structures evolving as selected operations of the methods shown in FIG. 2 are practiced, in accordance with some embodiments.

Methods 201 begin with receiving or depositing an LED film stack at operation 110. As noted above, the LED film stack architecture may vary. FIG. 3A illustrates an exemplary LED film stack 320 formed over a growth substrate 315. Growth substrate 315 may further include a carrier 305 and a buffer 310. Carrier 305 may be any support having suitable microstructure, such as, but not limited to, a silicon wafer (e.g., 300-450 mm), sapphire wafer, SiC wafer. A substantially monocrystalline substrate 305 may have any crystallographic orientation (e.g., (100), (111), or (110) for a cubic Si carrier). In one exemplary embodiment, carrier 305 is (100) silicon. For a (100) silicon carrier 305, the semiconductor surface may miscut, or offcut, for example 2-10° toward [110] to improve lattice match with overgrowth material, and/or promote polar or non-polar III-N growth directions. Buffer 310 may include one or more material layers. In some exemplary embodiments, buffer 310 includes an AlN nucleation layer and a III-N layer including Ga (e.g., GaN) over the nucleation layer. Buffer 310 may be 1-5 μm thick, for example.

Figure 3B:
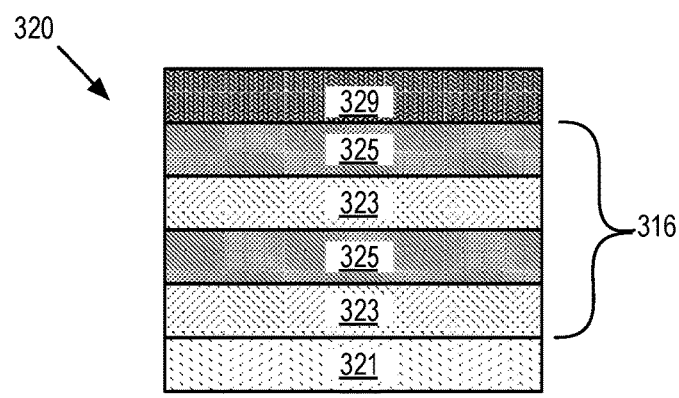
Figure 3C:
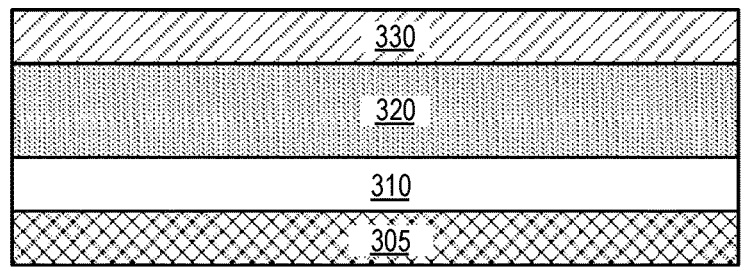
Figure 3D:
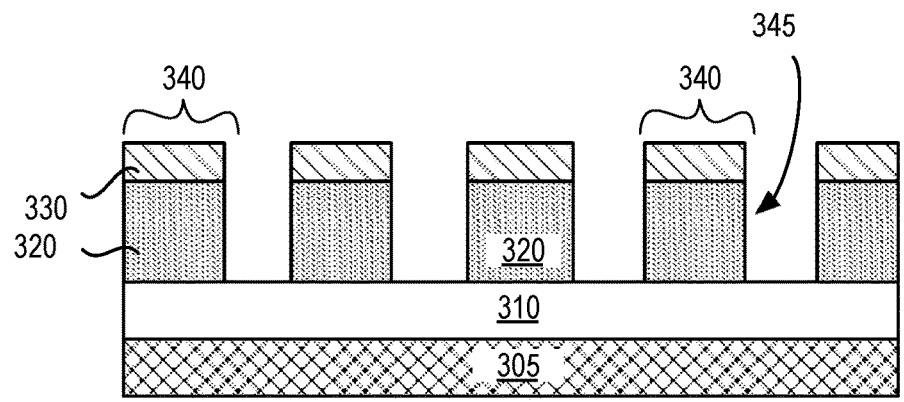

FIG. 3B illustrates an expanded cross-sectional view of LED film stack 320 in accordance with some III-N MQW embodiments. As shown, LED film stack 320 includes an MQW structure 316 between two complementary doped semiconductor regions (layers). In some embodiments layer 321 is n-type doped semiconductor and layer 329 is a p-type doped semiconductor. Alternatively, impurity-doped semiconductor layer 321 is p-type while impurity-doped semiconductor layer 329 is n-type. MQW structure 316 includes semiconductor heterojunctions forming a quantum well. The architecture of semiconductor MQW structure 316 is dependent on the desired emission band, and embodiments herein are not limited in that respect. For embodiments illustrated in FIG. 3B, MQW structure 316 includes GaN layers 325 interleaved with InGaN layers 323. AlGaN, AlGaInN, or other tertiary or quaternary layer compositions are also possible. LED film stack 320 may, for example, have a total thickness of 2-4 μm.

Returning to FIG. 2, methods 201 continue at operation 220 where a hardmask is deposited over the LED film stack. In the example illustrated in FIG. 3C, hardmask 330 is deposited on a top layer of LED film stack 320. Hardmask 330 is advantageously amorphous and may, for example include a dielectric such as silicon nitride (SiN), silicon oxide (SiO), silicon oxynitride (SiON), carbonaceous materials (e.g., diamond-like carbon), amorphous silicon, or spin-on materials (e.g., MSQ, HSQ, etc.). Hardmask 330 may have any number of layers and be of any thickness.

Methods 201 continue at operation 230 where a mask is formed and patterned, for example with any lithographic mask material, exposure and develop techniques. Unmasked portions of the hardmask and LED film stack are then etched with one or more etch processes. An anisotropic plasma etch process, for example, may be employed to pattern the hardmask and the underlying LED film stack. Many plasma etch processes suitable for materials, such as III-N materials, are known and embodiments herein are not limited in this respect. In the example further shown in FIG. 3D, the film etch process(es) delineate LED structures 340. At this stage, an individual LED structure 340 has a sidewall 345 that was exposed to the plasma etch process. In exemplary embodiments where LED film stack 320 includes an MQW structure, sidewall 345 defines an edge of the MQW structure. In the exemplary embodiment shown in FIG. 3D, LED structure patterning stops on buffer layer 310. Other stop layers are also possible. For example, LED structure patterning may not pass through all layers of the LED film stack.

Returning to FIG. 2, methods 201 continue at operation 240 where the III-N passivation material is formed on a sidewall surface of the LED structures. Operation 240 may be considered a specific implementation of operation 130 (FIG. 1) described above. The deposition technique(s) employed at operation 240 forms the III-N passivation layer much more readily on the sidewall surface of the LED structures (e.g., polar or non-polar crystalline III-N surfaces) than on the hardmask (e.g., amorphous surfaces). The hardmask can advantageously avoid the formation of AlN over surfaces that are to be contacted by an electrode (e.g., anode or cathode). Selective deposition operation 240 may therefore facilitate passivation of a sidewall surface of an LED structure without incurring a voltage drop at a contact to the LED structure. With little to no deposition on hardmask 330, LED structures 340 may grow laterally (e.g. lateral epitaxial growth) by approximately twice the thickness of the III-N passivation material 375. In some exemplary AlN embodiments, III-N passivation material 375 is deposited/grown to a thickness of 2-20 nm, as measured in a direction normal to a sidewall surface of an underlying seeding surface.

Figure 3E:
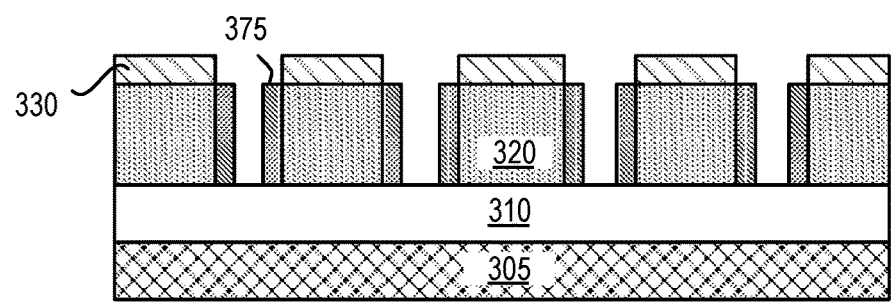

In some embodiments in accordance with FIG. 3E, a III-N passivation material 375 is deposited on the sidewalls of LED structures 340, and more particularly on a sidewall of one or more layers of an MQW structure. In some embodiments, the III-N passivation material 375 includes an AlN layer deposited by plasma assisted atomic layer deposition or epitaxy (ALE) directly on the sidewall of one or more layer of a p-GaN, InGaN, GaN, n-GaN MQW structure. III-N material, such as AlN, will not grow on hardmask 340 (e.g., SiN). Advantageously, the ALE temperature is 300-500° C. An exemplary aluminum source suitable for depositions in this low temperature range is Trimethylaluminum (TMA). Exemplary nitrogen sources include $NH_3$ and Hydrazine. Hydrazine may enable lower deposition temperatures than an $NH_3$ source. Hydrazine is however more challenging to handle, being toxic and unstable unless handled in solution. Safety precautions for handling hydrazine are similar to those of TMA and can be found commercially in various forms that facilitate use in III-N film growths. For example, RASIRC, Inc. makes a source of Hydrazine in which the Hydrazine is dissolved in an organic solvent. A semi-permeable membrane may be employed to separate a low pressure pure gas of Hydrazine from the solvent. Hydrazine derivatives may also be employed as a nitrogen source to form the III-N passivation material. For example, methylized derivatives of Hydrazine, such as $(CH_3)(H)NNH_2$, $(CH_3)_2NNH_2$, and $(CH_3)_3C(H)NNH_2$ are somewhat easier to handle and have been examined for the growth of nitrides. $(CH_3)_2NNH_2$ is a liquid with a vapor pressure of >80 Torr at room temperature, making it well-suited to III-N growth techniques.

Deposition of III-N passivation material 375 by ALE enables crystalline growth with precise thickness control as growth conditions may be made nearly self-limiting. Increased growth temperature can advantageously reduce carbon and oxygen impurities in the passivation material, as well as improving the refractive index and Al/N ratio. As such, the deposition temperature may be optimized to maintain LED stack quality and quality of III-N passivation material 375.

In some alternative embodiments, III-N passivation material 375 includes an AlN layer deposited by metal-organic chemical vapor deposition (MOCVD) directly on the sidewall of one or more layer of a p-GaN, InGaN, GaN, n-GaN MQW structure. With MOCVD, III-N materials such as AlN, will again fail to form on surfaces of hardmask 340. In some advantageous embodiments, the MOCVD temperature is no more than 500° C. Trimethylaluminum (TMA) can again be used as the aluminum source. With the use of Hydrazine or a derivative as the nitrogen source, AlN growth by MOCVD can occur at temperatures around 450° C., or less. Growth by MOCVD can also be crystalline with growth temperature and pressure controlling growth rates, and/or introduction of impurities, and/or the Al/N ratio.

Figure 3F:
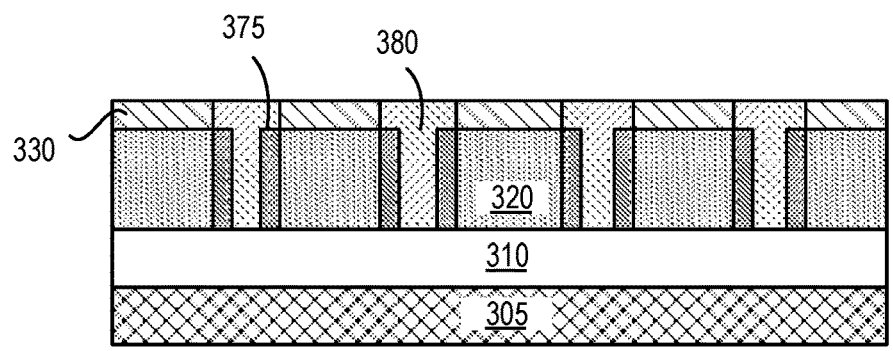
Figure 3G:
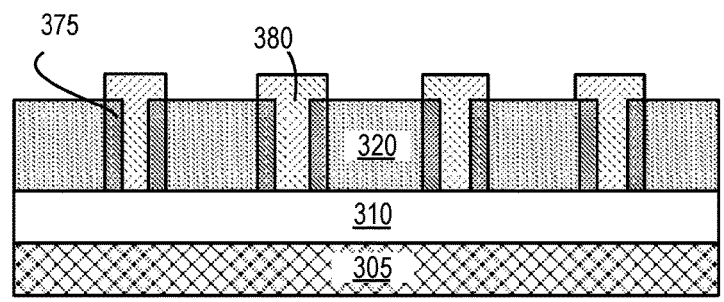
Figure 3H:
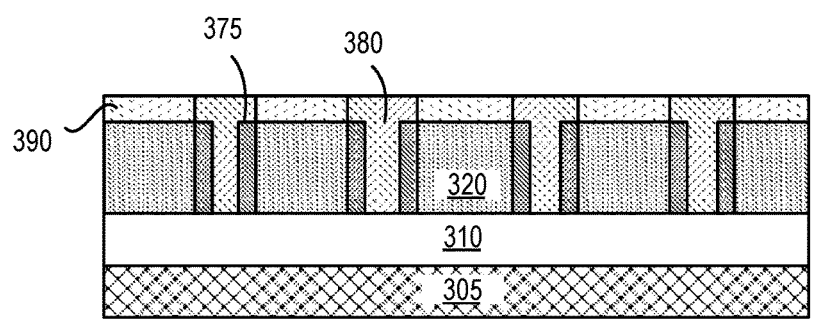
Figure 3I:
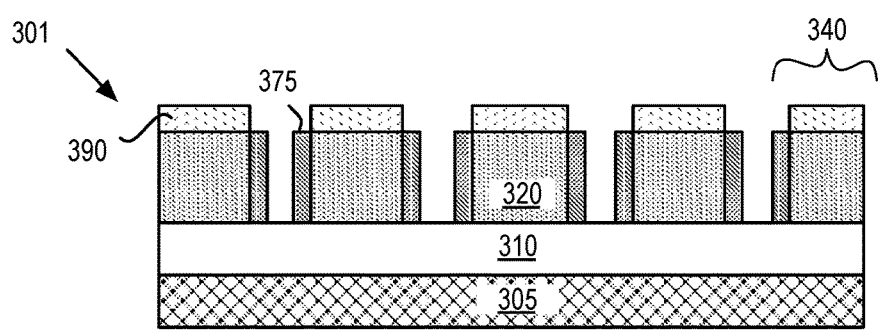

Returning to FIG. 2, with the LED structures now passivated further processing may be performed at operation 150 to facilitate subsequent assembly of the structures into various platforms, such as an active matrix display. In the example further illustrated in FIG. 3F-3I, an optically transmissive electrode is formed on the passivated LED structures. As shown in FIG. 3F, a sacrificial material 380 is deposited to backfill around LED structures 340. Sacrificial material 380 may be any dielectric known to have suitable gap-fill properties, and is preferably of a composition other than that of hardmask 330. Sacrificial material 380 is planarized with LED structures 340, exposing a surface of hardmask 330. Hardmask 330 is then removed, as further shown in FIG. 3G, to expose a top surface of the LED structures (e.g., a p-type GaN layer). Hardmask 330 may be removed selectively to sacrificial material 380 such that the top surface of the LED structures become recessed relative to a top surface of sacrificial material 380. Electrode 390 is then deposited over the LED structures, and planarized with sacrificial material 380, as shown in FIG. 3H. Electrode 390 may be of any composition known to be suitable for the application. In some embodiments, electrode 390 is a conductive oxide that is optically transmissive (e.g., transparent) over at least a portion of the band emitted by the LED structure. For example, electrode 390 may be an indium tin oxide (ITO). Sacrificial material 380 may then be removed selectively to reveal passivated LED structures 340, which include at least one electrode (cathode or anode). LED array 301 shown in FIG. 3I is then ready for further processing and/or assembly into a display.

Notably, as a result of the selective III-N passivation and subsequent replacement of the hardmask with electrode 390, III-N passivation material 375 is absent from surfaces of electrode 390. The presence of III-N passivation material 375 on a sidewall of all layers of the MQW as well as on a sidewall of at least the impurity-doped III-N layer that is in contact with electrode 390 is also indicative of methods 201.

Figure 4:
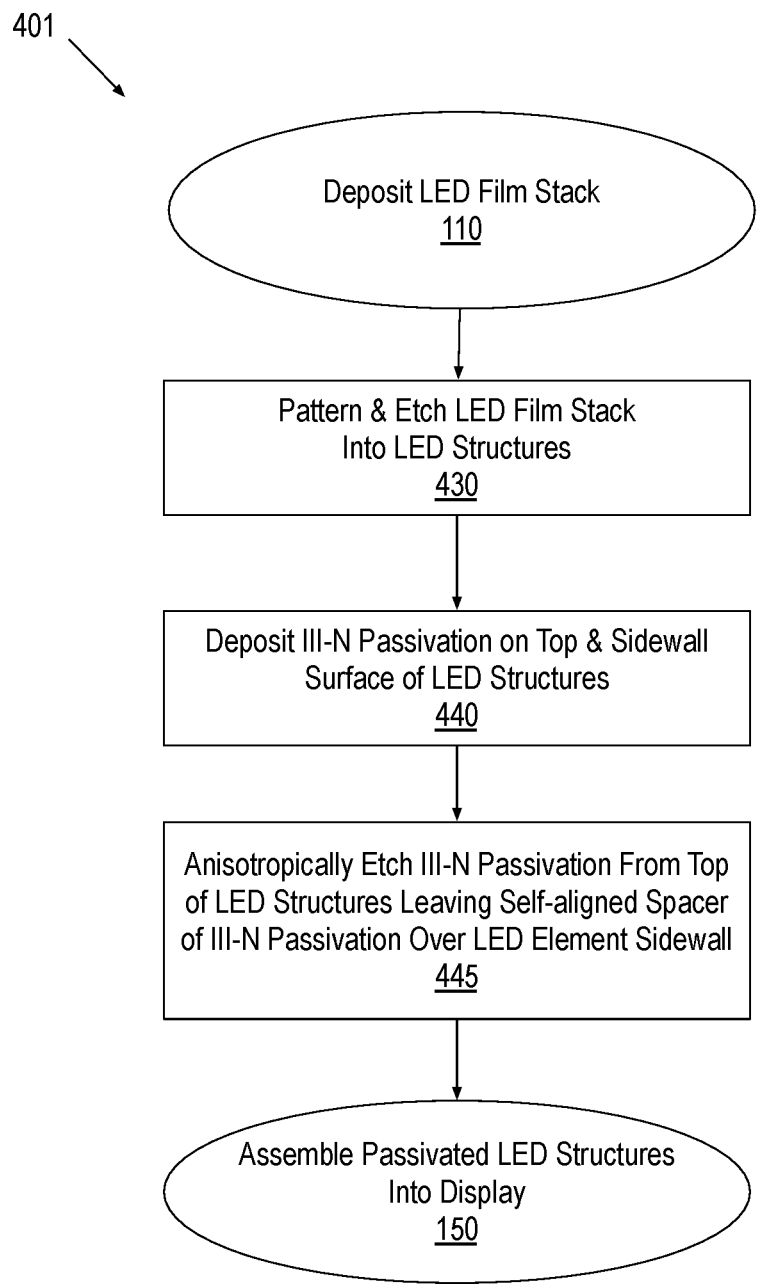
FIG. 4 illustrates a flow diagram of methods for selectively retaining a passivation material on an LED structure, in accordance with some embodiments.

FIG. 4 illustrates a flow diagram of methods 401 for selectively retaining a passivation material on an LED structure, in accordance with some embodiments. In methods 401, a non-selectively deposited passivation material is selectively retained on a sidewall of one or more LED material layers. Methods 401 may be considered a subset of methods 101. FIG. 5A-5F illustrate cross-sectional views of LED structures evolving as selected operations of the methods 401 are practiced, in accordance with some embodiments. Structural features called out in FIG. 5A-5F are therefore applicable to both methods 401 and 101.

Figure 5A:
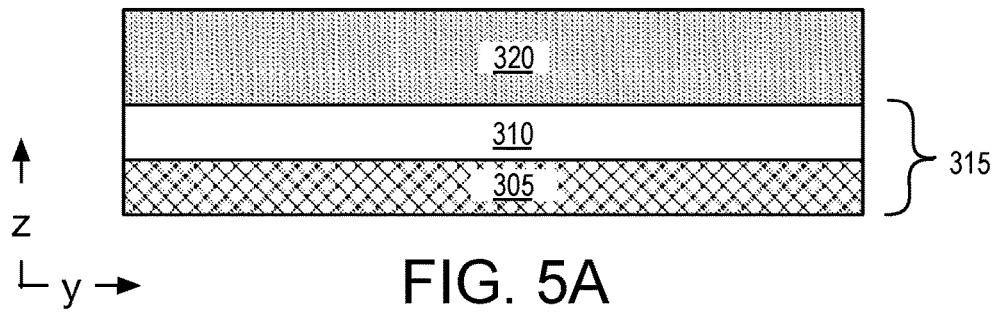
FIGS. 5A, 5B, 5C, 5D, 5E, 5F illustrate cross-sectional views of LED structures evolving as selected operations of the methods shown in FIG. 4 are practiced, in accordance with some embodiments.
Figure 5B:
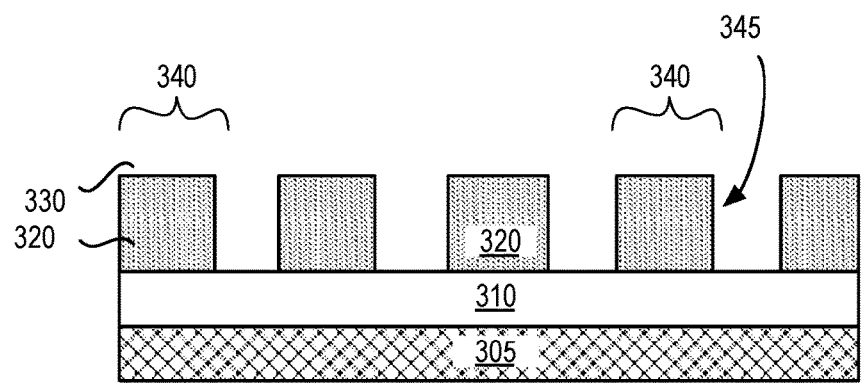

Methods 401 begin with receiving or depositing an LED film stack at operation 110. As noted above, the LED film stack architecture may vary and may be any of those described above in the context of methods 101 or methods 201. FIG. 5A illustrates an exemplary film LED film stack 320. As described elsewhere herein, LED film stack 320 may include an MQW structure (e.g., MQW structure 316 in FIG. 3B), and be grown, for example by MOCVD, over growth substrate 315 that further includes carrier 305 and buffer 310.

Figure 5C:
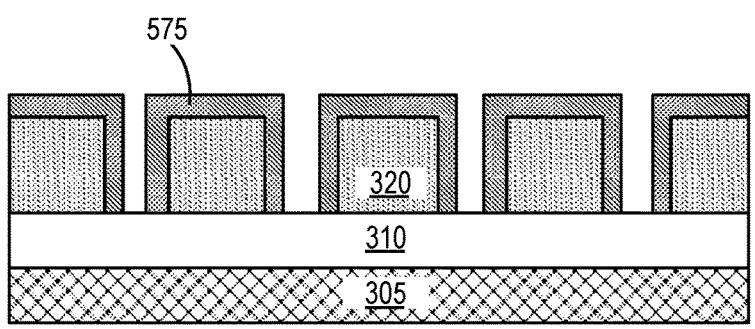

Returning to FIG. 4, methods 401 continue with patterning a mask and performing a masked etch of the LED film stack to form LED structures. Any of the techniques described in the context of etching operation 230 may be practiced at operation 440. As further shown in FIG. 5B, for example, LED structures 340 may be formed during etching operation 440. Methods 401 (FIG. 4) continue at operation 440 where III-N passivation material is formed on a top and a sidewall surface of the LED structures. Operation 440 may again be considered a specific implementation of operation 130 (FIG. 1) described above. The deposition technique(s) employed at operation 440 forms the III-N passivation layer unselectively on the top and sidewall surface of the LED structures (e.g., polar or non-polar crystalline III-N surfaces). FIG. 5C illustrates one example of a III-N passivation material 575 deposited/grown to a thickness of 2-20 nm over both a top and sidewall of LED structure 340.

In some embodiments in accordance with FIG. 3E, III-N passivation material 575 is deposited on a sidewall of one or more layers of an MQW structure. In some embodiments, the III-N passivation material 575 includes an AlN layer deposited by plasma assisted atomic layer deposition or epitaxy (ALE) directly on the sidewall of one or more layer of a p-GaN, InGaN, GaN, n-GaN MQW structure. In alternative embodiments, III-N passivation material 575 is deposited by MOCVD. In advantageous embodiments, the ALE or MOCVD temperature less than 500° C. Any of the sources and/or other growth parameters described above in the context of operation 240 (FIG. 2) may be employed to grow III-N passivation material 575.

Figure 5D:
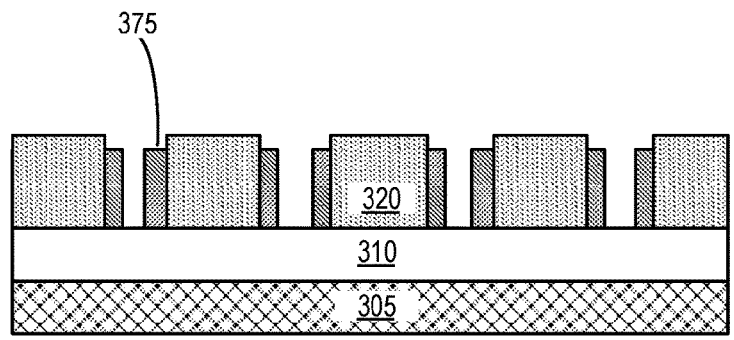

Returning to FIG. 4, methods 401 continue at operation 445 where the III-N passivation material is anisotropically etched, removing it from the top of the LED structures while retaining it along the LED structure sidewall. Any etch process with suitable anisotropy may be employed, such as one or more plasma etch process known to be suitable for the passivation material. Operation 445 therefore generates a spacer of III-N passivation material surrounding the sidewall LED structure. Operation 445 is not dependent on mask patterning operations and may be performed with a blanket (unmasked) etch. The III-N passivation material may therefore be consider "self-aligned" to the sidewall of the LED structures. FIG. 5D further illustrates one example of III-N passivation material 575 recessed etched into a spacer of III-N passivation material 375. As shown, over etch during the etchback of the III-N passivation material may recess III-N passivation material 375 below the height of LED film stack 320. As such, III-N passivation material 375 may be absent from one or more material layer within LED film stack 320, such as an impurity-doped III-N layer.

Figure 5E:
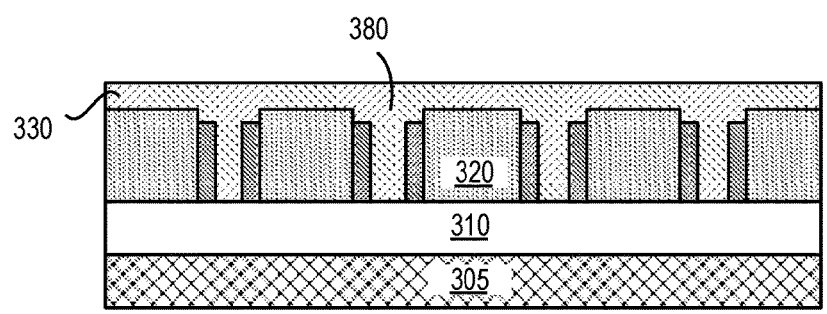
Figure 5F:
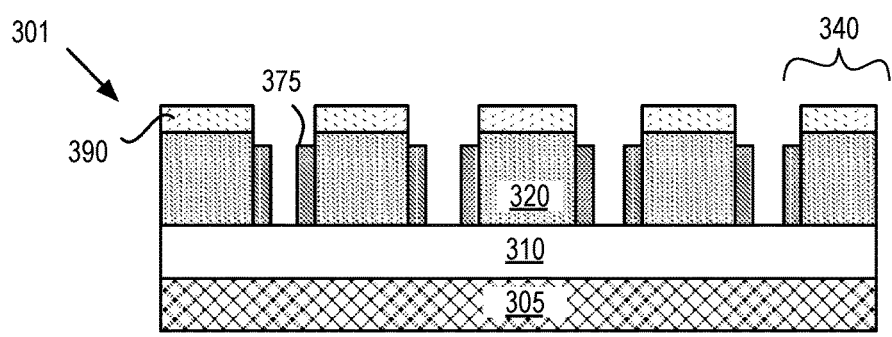

Returning to FIG. 4, further processing may be performed at operation 150 to facilitate subsequent assembly of the structures into various platforms, such as an active matrix display. In the example further illustrated in FIG. 5E-5F, electrode 390 is formed on the passivated LED structures. As shown in FIG. 5E, sacrificial material 380 is deposited to backfill around the LED structures. Sacrificial material 380 may be planarized with the LED structures, and a top surface of the LED structures recessed and then topped with electrode 390. Alternatively, sacrificial material 380 may be patterned to form openings over the LED structures and the recesses backfilled with electrode 390. Sacrificial material 380 is then removed selectively to reveal passivated LED structures 340, which now include at least one electrode (cathode or anode). LED array 301 shown in FIG. 5F is then ready for further processing and/or assembly into display arrays.

Figure 6:
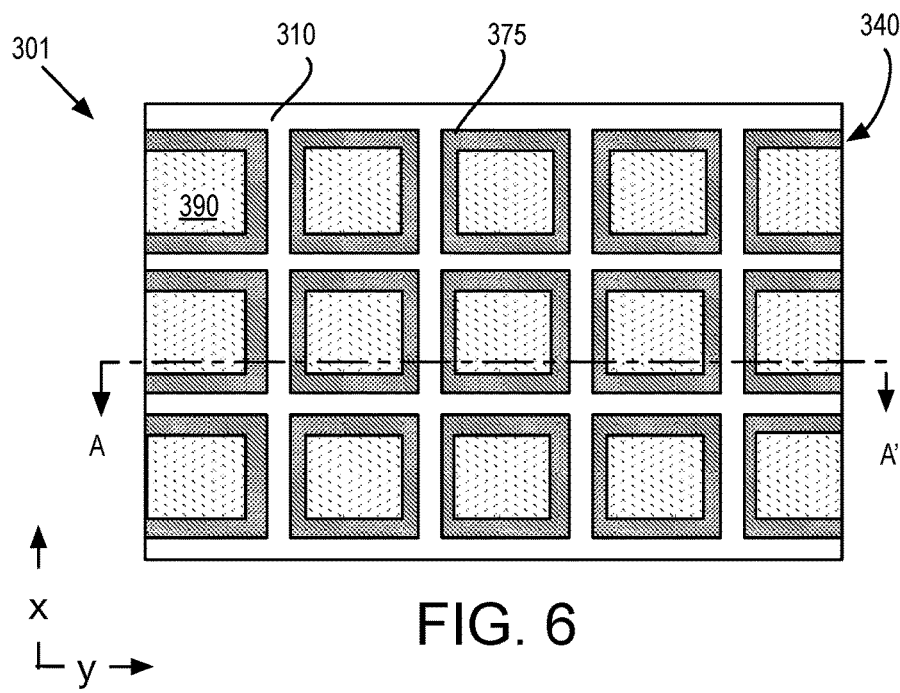
FIG. 6 illustrates a top-down plan view of an LED array following passivation, in accordance with some embodiments.

FIG. 6 illustrates a top-down plan view of LED array 301 following III-N passivation, in accordance with some embodiments. LED array 301 may have been fabricated by either methods 201 or methods 401, for example. As shown, III-N passivation material 375 forms a perimeter sidewall of each LED structure 340. LED structures 340 may be rectangular (e.g., square with a 1-10 μm side), or patterned to have alternative shapes (e.g., a circular footprint). The reference line A-A' depicts an exemplary location of the cross-sectional views 3A-3I and 5A-5F.

Figure 7:
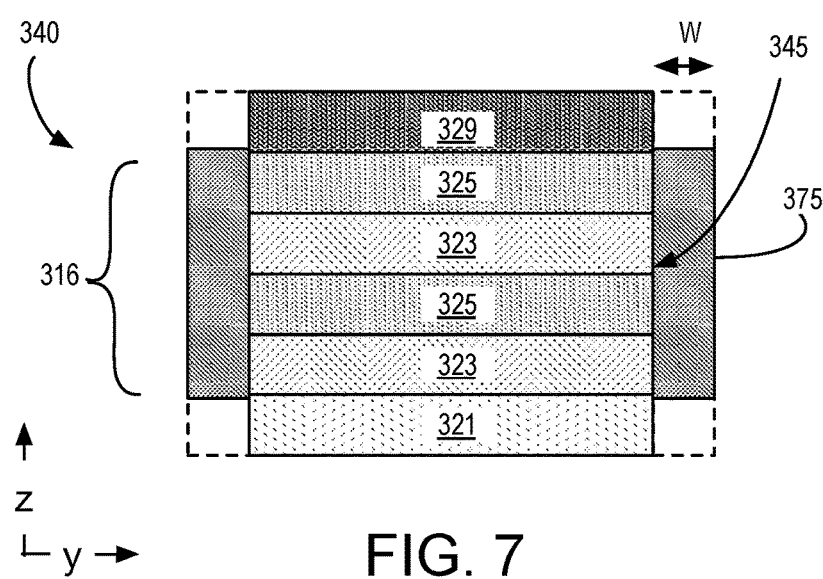
FIG. 7 illustrates a cross-sectional view of a passivated LED structure, in accordance with some embodiments.

FIG. 7 illustrates a cross-sectional view of a passivated LED structure 340, in accordance with some embodiments. As shown, III-N passivation material 375 is in contact with a sidewall of at least the layers 323 and 325 within MQW 316. III-N passivation material 375 may be absent or present along sidewalls of impurity-doped III-N layers 321 and 329, as denoted by the dashed lines in FIG. 7. For example, III-N passivation material 375 may be absent from a sidewall of impurity-doped III-N layer 321 for embodiments where layer 321 is not etched during patterning of the LED structures. As another example, III-N passivation material 375 may be absent from impurity-doped III-N layer 329 for embodiments where passivation material 375 is recessed during a spacer etch process. The absence or presence of passivation material from these regions may be particularly indicative of the methods employed to form the passivation.

Figure 8A:
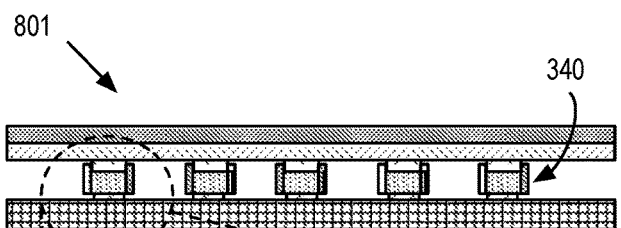
FIG. 8A and 8B illustrate a side view of a $\mu$LED display assembly including passivated LED structures, in accordance with some embodiments.
Figure 8B:
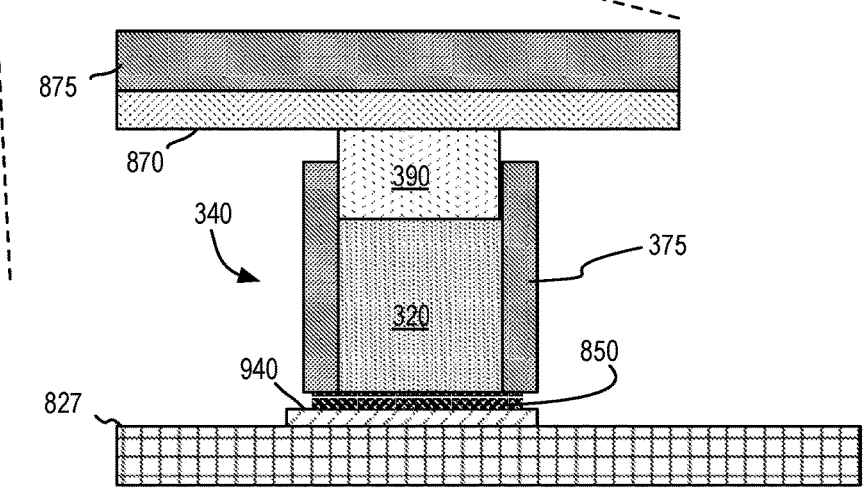

FIG. 8A and 8B illustrate a side view of a μLED active matrix display assembly 801 including passivated μLED structures 340, in accordance with some embodiments. As shown in the expanded view of FIG. 8B, LED structure 340 includes electrode 390 on a first (top) side of LED film stack 320, and III-N passivation 375 on a sidewall of LED film stack 320. An electrode 850 is further coupled to a second (back) side of LED film stack 320. Electrode 850 is electrically coupled to a display backplane 827 through an interconnect feature 940 (e.g., a micro bump, post, or other solder feature, a conductive adhesive, or the like). Display backplane 827 may have any architecture, but in some exemplary embodiments backplane 827 includes LED drive circuitry. Such drive circuitry may include a plurality of transistors, which in some embodiments are thin film transistors (not depicted). To fabricate assembly 801, passivated LEDs in accordance with any embodiments described elsewhere herein may be pick-and-placed or printed onto backplane 827 or display cover 875. Furthermore, display assembly 801 may provide touch capability via a capacitive, inductive, resistive, or optical touchscreen, for example with a touch sensor layer 870.

The devices, systems, and fabrication techniques discussed herein are applicable to micro light emitting diodes that have low power consumption, high pixel density (e.g., greater than 3,000 PPI), high brightness, and low manufacturing costs. Furthermore, as discussed, the μLED structures described herein may be utilized in display devices of any type or form factor for host devices or platforms having any form factor. For example, a mobile platform may include a processor, a memory coupled to a processor, a wireless transceiver, and a display including any μLED structures discussed elsewhere herein. For example, the system may be a mobile computing platform or device such as a watch, a smartphone, a tablet, or a laptop, an augmented reality device, a virtual reality device, a headset, or an infrastructure device such as a television, a monitor, a desktop computer, or the like.

Figure 9:
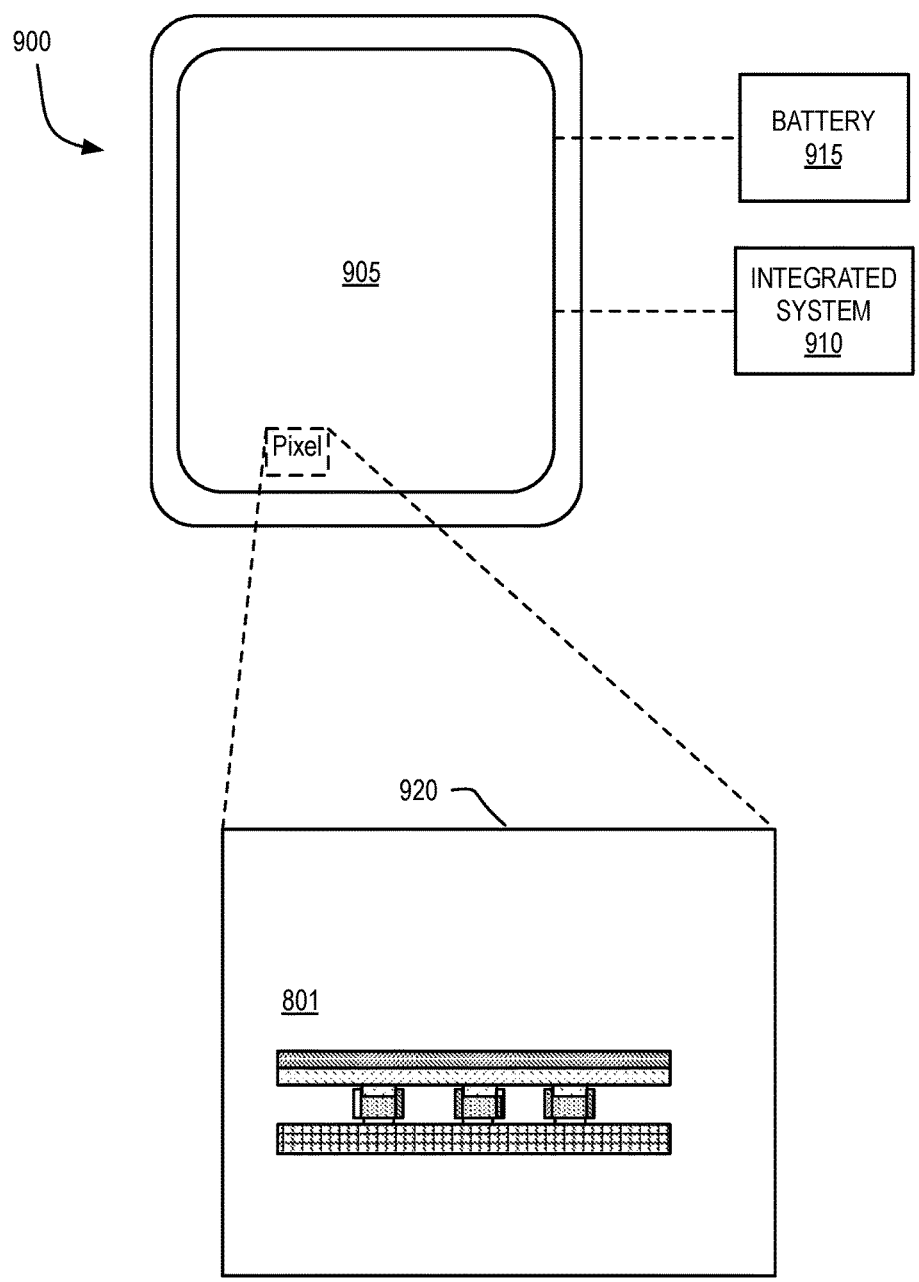
FIG. 9 is a schematic of an electronic computing device including a $\mu$LED display assembly, in accordance with some embodiments.

FIG. 9 illustrates a system or platform 900 including a display 905 that employs passivated μLED structures arranged in accordance with some exemplary embodiments. Platform 900 may be a portable device configured for electronic data display, electronic data processing, wireless electronic data transmission, or the like. Although illustrated as a tablet, computing platform 900 may be any of a tablet, a smartphone, a laptop computer, a watch, an augmented reality device, a virtual reality device, a headset, etc. Display 905 may employ μLED active matrix display assembly 801. For example, as illustrated in expanded view 920, three passivated μLED structures of differing emission colors (e.g., RGB) are employed in a display pixel. Although illustrated with respect to mobile computing platform 900, the passivated LED structures discussed herein may also be employed in a display of a desktop computer, television, or similar infrastructure device.

Also as further shown, mobile computing platform 900 includes a chip-level or package-level integrated system 910 and a battery 915. Integrated system 910 may include may include memory circuitry (e.g., random access memory, storage, etc.), processor circuitry (e.g., a microprocessor, a multi-core microprocessor, graphics processor, etc.), and communications circuitry (e.g., a wireless transceiver, a radio frequency integrated circuit, a wideband RF transmitter and/or receiver, etc.). The components of integrated system 910 may be communicatively coupled to one another for the transfer of data within integrated system. Functionally, memory circuitry may provide memory and storage for integrated system 910 including image and/or video data for output by display 905, processor circuitry may provide high level control for mobile computing platform 900 as well as operations corresponding to generating image and/or video data for output by display 905. Communications circuitry may transmit and/or receive data including image and/or video data for output to display 905. For example, communications circuitry may be coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Battery 915 may be coupled to integrated system 910 and/or display 905 and supply power during operation of platform 900.

Figure 10:
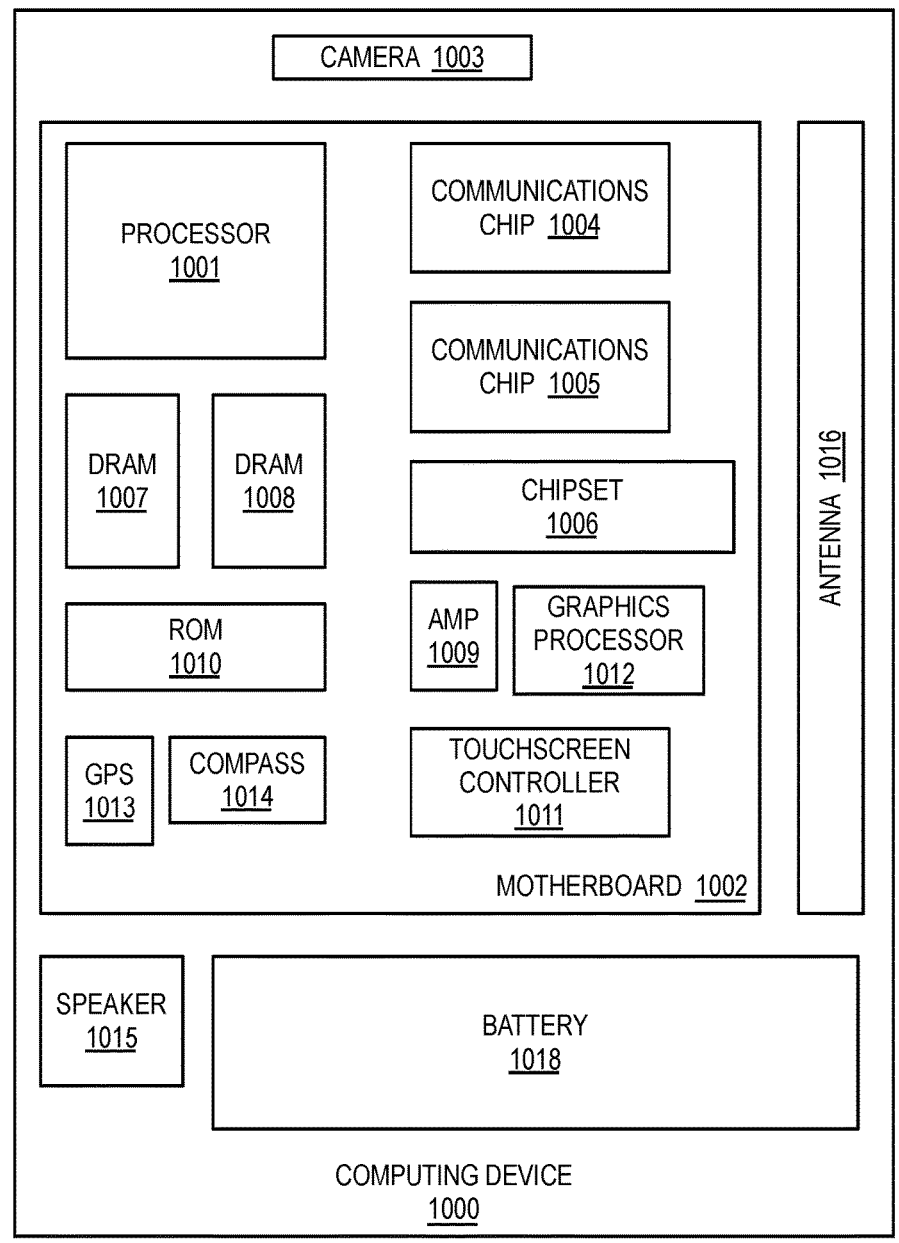
FIG. 10 is a functional block diagram of an electronic computing device, in accordance with some embodiments.

FIG. 10 is a functional block diagram of a computing device 1000, arranged in accordance with at least some implementations of the present disclosure. Computing device 1000 or portions thereof may be implemented within computing platform 900, for example. Device 1000 includes a motherboard 1002 hosting a number of components, such as but not limited to a processor 1001 (e.g., an applications processor, a microprocessor, etc.) and one or more communications chips 1004, 1005. Processor 1001 may be physically and/or electrically coupled to motherboard 1002. In some examples, processor 1001 includes an integrated circuit die packaged within the processor 1001. In general, the term "processor" may refer to any device or portion of a device that processes electronic data from registers and/or memory to transform that electronic data into other electronic data that may be stored in registers and/or memory.

In various examples, one or more communication chips 1004, 1005 may also be physically and/or electrically coupled to the motherboard 1002. In further implementations, communication chips 1004 may be part of processor 1001. Depending on its applications, computing device 1000 may include other components that may or may not be physically and electrically coupled to motherboard 1002. These other components may include, but are not limited to, volatile memory (e.g., DRAM) 1007, 1008, non-volatile memory (e.g., ROM) 1010, a graphics processor 1012, flash memory, global positioning system (GPS) device 1013, compass 1014, a chipset 1006, an antenna 1016, a power amplifier 1009, a touchscreen controller 1011, a speaker 1015, a camera 1003, and a battery 1018, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like. Touchscreen controller 1011 may, for example, interface with a backplane of display assembly 801 (FIG. 8).

Communication chips 1004, 1005 may enable wireless communications for the transfer of data to and from the computing device 1000. The term "wireless" and its derivatives may be used to describe circuits, devices, systems, methods, techniques, communications channels, etc., that may communicate data through the use of modulated electromagnetic radiation. The term does not imply that the associated devices do not contain any wires, although in some embodiments they might not. Communication chips 1004, 1005 may implement any of a number of wireless standards or protocols, including but not limited to those described elsewhere herein. For example, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others. One or both of communication chips 1004, 1005 may provide a wireless transceiver for computing device 1000.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. For example the above embodiments may include specific combinations of features as further provided below.

In one or more first examples, a light emitting diode (LED) structure, comprises a p-type semiconductor material, an n-type semiconductor material, and a multiple quantum well (MQW) structure there between. The MQW comprises a III-N material layer. The LED structure comprises a passivation material over a sidewall of the MQW structure. The passivation material comprises a III-N material including Al.

In one or more second examples, for any of the first examples the III-N material including Al has a wider band gap than any of the III-N material layers of the MQW structure.

In one or more third examples, for any of the first or second examples the III-N material including Al is predominantly a binary compound of AlN.

In one or more fourth examples, for any of the first, second, or third examples the one or more layers of III-N material have an area no more than 100 $\mu m^2$, and the III-N material including Al is in direct contact with the one or more layers of III-N material.

In one or more fifth examples, for any of the first, second, third, or fourth examples the III-N material including Al has a thickness of 2-100 nm.

In one or more sixth examples, for any of the first, second, third, fourth, or fifth examples at least one of the p-type and n-type semiconductor comprises an impurity-doped III-N material. The passivation material is also over a sidewall of the impurity-doped III-N material.

In one or more seventh examples, for any of the first, second, third, fourth, fifth, or sixth examples both the p-type and n-type semiconductor comprise impurity-doped III-N materials. The passivation layer is absent from a sidewall of at least one of the p-type and n-type semiconductor.

In one or more eighth examples, for any of the first, second, third, fourth, fifth, sixth, or seventh examples the LED structure further comprises at least one of an anode material or a cathode material. The anode or cathode material comprises a conductive oxide, and the passivation layer is absent from a sidewall of the conductive oxide.

In one or more ninth examples, an emissive display device comprises a backplane comprising drive circuitry, a display cover, and an array of light emitting diode (LED) structures coupled to the backplane. An individual LED structure comprises the LED structure of any of the first, second, third, fourth, fifth, sixth, seventh or eighth examples.

In one or more tenth examples, an emissive display device comprises a backplane comprising drive circuitry, a display cover, and an array of light emitting diode (LED) structures coupled to the backplane. An individual LED structure comprises a multiple quantum well (MQW) structure comprising one or more layers of III-N material coupled between an anode and a cathode. A passivation material is over a sidewall of the MQW structure, wherein the passivation material comprises AlN in direct contact with the one or more layers of the III-N material.

In one or more eleventh examples, the display device for any of the tenth examples further comprises a processor coupled to the backplane, a memory coupled to the processor, a battery coupled to at least one of the processor, memory, and backplane.

In one or more twelfth examples, the display device for any of the tenth or eleventh examples further comprises a radio transceiver coupled to the processor, the radio operable over a wireless transmission band.

In one or more thirteenth examples, the display device for any of the tenth, eleventh, or twelfth examples the one or more layers of III-N material have an area no more than 100 $\mu m^2$. The LED structure further comprises an impurity-doped III-N material between the MQW. At least one of the anode and cathode comprises a conductive oxide. The AN passivation material is absent from surfaces of at least one of the impurity-doped III-N material or conductive oxide.

In one or more fourteenth examples, a method of fabricating light emitting diodes (LEDs), the method comprises depositing a film stack including a multiple quantum well (MQW) structure comprising one or more layers of III-N material. The method comprises patterning the film stack into structures, exposing a sidewall of the MQW structure. The method comprises depositing a passivation material over a sidewall of the MQW structure, wherein the passivation material comprises a III-N material including Al.

In one or more fifteenth examples, for any of the fourteenth examples depositing the film stack further comprises depositing a mask material over the MQW structure. Patterning the film stack comprises etching through the mask material and etching through the film stack. Depositing the passivation material comprises depositing an AlN layer, comprising predominantly Al and N, on the sidewall of the MQW structure at a greater rate than on surfaces of the mask material.

In one or more sixteenth examples, for any of the fourteenth or fifteenth examples depositing the AN layer further comprises performing a plasma assisted atomic layer deposition or metal-organic chemical vapor deposition (MOCVD) at a temperature of less than 500° C.

In one or more seventeenth examples, for any of the fourteenth, fifteenth or sixteenth examples the AlN layer deposition comprises conveying hydrazine or a hydrazine derivative into a reaction chamber.

In one or more eighteenth examples, for any of the fourteenth, fifteenth, sixteenth, or seventeenth examples depositing the passivation material comprises depositing an AlN layer, comprising predominantly Al and N, on the sidewall of the MQW structure. The method further comprises forming a self-aligned spacer of the AN layer along the sidewall of the MQW structure by anisotropically etching through the AN layer.

In one or more nineteenth examples, for any of the fourteenth, fifteenth, sixteenth, seventeenth, or eighteenth examples depositing the AN layer further comprises performing a plasma assisted atomic layer deposition or metal-organic chemical vapor deposition (MOCVD) at a temperature of less than 500° C.

In one or more twentieth examples, for any of the fourteenth, fifteenth, sixteenth, seventeenth, eighteenth, or nineteenth examples the AlN layer deposition further comprises conveying hydrazine or a hydrazine derivative into a reaction chamber.

In one or more twenty-first examples, the method of any of the fourteenth, fifteenth, sixteenth, seventeenth, eighteenth, nineteenth, or twentieth examples further comprises depositing a sacrificial material around the structures after depositing the passivation material. The method further comprises planarizing a top surface of sacrificial material with a top surface of the structures. The method further comprises recessing the top surface of the structures relative to the top surface of the sacrificial material. The method further comprises backfilling the recessed structures with a conductive oxide that is optically transmissive within at least a portion of an emission band over which the LED is to emit.

However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:
1. A light emitting diode (LED) structure, comprising:
a semiconductor material stack comprising a p-type semiconductor material, an n-type semiconductor material, and a multiple quantum well (MQW) structure therebetween, wherein the MQW structure comprises a III-N material layer; and
a passivation material in contact with a sidewall of the MQW structure, but not in contact with any portion of a top surface of the semiconductor material stack, wherein the passivation material comprises a III-N material including Al and
the passivation material is absent from at least a portion of a sidewall of at least one of the p-type and n-type semiconductor materials.
2. The LED structure of claim 1, wherein the III-N material including Al has a wider band gap than any of the III-N material layers of the MQW structure.
3. The LED structure of claim 2, wherein the III-N material including Al is predominantly a binary compound of AlN.
4. The LED structure of claim 1, wherein:
the III-N material layer has an area no more than 100 µm$^2$; and
the III-N material including Al is in direct contact with the III-N material layer.
5. The LED structure of claim 4, wherein the III-N material including Al has a thickness of 2-100 nm.
6. The LED structure of claim 1, wherein:
at least one of the p-type and n-type semiconductor materials comprises an impurity-doped III-N material; and
the passivation material is also over a sidewall of one of the p-type and n-type semiconductor materials.
7. The LED structure of claim 1, wherein:
both the p-type and n-type semiconductor materials comprise impurity-doped III-N materials; and
the passivation material is absent from at least a portion of a sidewall of at least the p-type or n-type semiconductor material that is at a top of the semiconductor material stack.
8. The LED structure of claim 1, further comprising
at least one of an anode material or a cathode material, and wherein:
the anode or cathode material comprises a conductive oxide having an area substantially equal to that of the top surface of the semiconductor material stack; and
the passivation material is not in contact with any portion of a sidewall of the conductive oxide.
9. The LED structure of claim 1, wherein the passivation material is absent from at least a portion of a sidewall of the p-type or n-type semiconductor material that is at a bottom of the semiconductor material stack.
10. The LED structure of claim 9, wherein the passivation material is also over a sidewall one the p-type or n-type semiconductor material that is at a top of the semiconductor material stack.
11. The LED structure of claim 1, wherein:
the III-N material including Al is predominantly a binary compound of AlN with a wider band gap than any of the III-N material layers of the MQW structure
the III-N material layer has an area no more than 100 µm$^2$; and
the III-N material including Al is in direct contact with the III-N material layer of the MQW.
12. The LED structure of claim 1, wherein the III-N material comprises GaN layers interleaved with InGaN layers.
13. The LED structure of claim 1, wherein the passivation material is crystalline, with a c-axis of the passivation material aligned with a c-axis of the MQW structure.
14. An emissive display device, comprising:
a backplane comprising drive circuitry;
a display cover; and
an array of light emitting diode (LED) structures coupled to the backplane, wherein an individual LED structure comprises the LED structure of claim 1.
15. The display device of claim 14, further comprising:
a processor coupled to the backplane;
a memory coupled to the processor; and
a battery coupled to at least one of the processor, memory and backplane.
16. The display device of claim 15, further comprising:
a radio transceiver coupled to the processor, the radio operable over a wireless transmission band.
17. The display device of claim 15, wherein:
the III-Nmaterial including Al is predominantly is a binary compound of AlN in direct contact with the one or more layers of III-N material;
the one or more layers of III-N material have an area no more than 100 µm$^2$;
the LED structure further comprises an impurity-doped III-N material between the MQW and anode or cathode;
at least one of the anode and cathode comprises a conductive oxide; and
the AlN passivation material is absent from at least a portion of a sidewall surface of at least one of the impurity-doped III-N material or conductive oxide.
18. The emissive display device of claim 14, wherein the passivation material is absent from at least a portion of a spacing between adjacent ones of the LED structures in the array.
19. The emissive display device of claim 14, wherein a first of an anode material and a cathode material is between the LED structure and the backplane, and wherein the passivation material is absent from the first of the anode or cathode material.

20. A light emitting diode (LED) structure, comprising:
a p-type impurity-doped III-N semiconductor material, an n-type impurity-doped III-N semiconductor material, and a multiple quantum well (MQW) structure therebetween, wherein the MQW structure comprises a III-N material layer; and
a passivation material over a sidewall of the MQW structure, wherein the passivation material comprises a III-N material including AlN and is absent from a sidewall of at least one of the p-type and n-type impurity-doped III-N semiconductor materials.

* * * * *